United States Patent [19]
Eaton et al.

[11] Patent Number: 5,892,370
[45] Date of Patent: Apr. 6, 1999

[54] CLOCK NETWORK FOR FIELD PROGRAMMABLE GATE ARRAY

[75] Inventors: David D. Eaton, San Jose; Mukesh T. Lulla, Fremont; Ker-Ching Liu, San Jose, all of Calif.

[73] Assignee: QuickLogic Corporation, Sunnyvale, Calif.

[21] Appl. No.: 781,985

[22] Filed: Jan. 3, 1997

Related U.S. Application Data

[63] Continuation-in-part of Ser. No. 667,702, Jun. 21, 1996, Pat. No. 5,825,201.

[51] Int. Cl.$^6$ .............................. H03K 7/38; H03K 19/00
[52] U.S. Cl. ................................. 326/39; 326/93; 326/41; 327/297
[58] Field of Search ................................... 326/93, 39, 41, 326/95; 327/297

[56] References Cited

U.S. PATENT DOCUMENTS

| | | | |
|---|---|---|---|
| 4,439,804 | 3/1984 | Riddle et al. ............................. | 361/92 |
| 4,758,745 | 7/1988 | Elgamal et al. . | |
| 4,857,774 | 8/1989 | El-Ayat et al. . | |
| 4,910,417 | 3/1990 | El Gamal et al. . | |
| 5,010,258 | 4/1991 | Usami et al. ............................. | 326/39 |
| 5,053,909 | 10/1991 | Suzuki et al. . | |
| 5,055,718 | 10/1991 | Galbraith et al. . | |
| 5,083,083 | 1/1992 | El-Ayat et al. . | |
| 5,132,563 | 7/1992 | Fujii et al. . | |
| 5,194,759 | 3/1993 | El-Ayat et al. ...................... | 307/202.1 |
| 5,196,724 | 3/1993 | Gordon et al. . | |
| 5,208,530 | 5/1993 | El-Ayat et al. . | |
| 5,220,213 | 6/1993 | Chan et al. ............................. | 307/465 |
| 5,243,226 | 9/1993 | Chan . | |
| 5,302,546 | 4/1994 | Gordon et al. . | |
| 5,304,871 | 4/1994 | Dharmarajan et al. . | |
| 5,327,024 | 7/1994 | Cox . | |
| 5,336,986 | 8/1994 | Allman . | |
| 5,341,030 | 8/1994 | Galbraith . | |
| 5,347,519 | 9/1994 | Cooke et al. .......................... | 371/22.2 |
| 5,367,207 | 11/1994 | Goetting et al. . | |

(List continued on next page.)

OTHER PUBLICATIONS

Actel FPGA Data Book and Design Guide, pp. ix–xv, 1–5 through 1–34, 1–51 through 1–101, 1–153 through 1–222, 3–1 through 4–56 (1995).
Xilinx, "The Programmable Gate Array Design Book", First Edition, pp. 1–9 through 2–73 (1986).
S. Brown, et al., "Field Programmable Gate Arrays", pp. 1–43 and 88–202 (1992).
S. Trimberger, "Field Programmable Gate Array Technology", pp. 1–14 and 98–170 (1994).
D. Pellerin, et al., "Practical Design Using Programmable Logic", pp. 84–98 (1991).
Advanced Micro Devices, PAL Device Book and Design Guide, pp. 2–236 through 2–247 (1993).
QuickLogic Data Book, pp. 1–5 through 2–11 and 6–3 through 6–18 (1995).
Actel FPGA Data Book and Design Guide, pp. 3–37 through 3–41 and 3–73 through 3–78 (1995).
Xilinx, "The Programmable Logic Data Book", pp. 8–11 through 8–36 (1994).

*Primary Examiner*—Michael Tokar
*Assistant Examiner*—Richard Roseen
*Attorney, Agent, or Firm*—Skjerven, Morrill, MacPherson, Franklin & Friel LLP

[57] ABSTRACT

A clock network of a field programmable gate array has a first clock bus extending across the chip in a first dimension. A clock pad can be coupled to the first clock bus if the clock network is to be driven from the clock pad. An output of a selected logic cell can be coupled to the first clock bus if the clock network is to be driven from a logic cell. To increase speed of the clock network, the first clock bus is segmented (in one embodiment, collinearly extending segments can be selectively coupled together via selectively programmable antifuses) so that only a short piece of the first clock bus is used to couple either the pad or the logic cell to the clock network in high speed applications.

19 Claims, 2 Drawing Sheets

U.S. PATENT DOCUMENTS

| | | | |
|---|---|---|---|
| 5,391,942 | 2/1995 | El-Ayat et al. | 326/39 |
| 5,397,939 | 3/1995 | Gordon et al. | |
| 5,416,367 | 5/1995 | Chan et al. | |
| 5,424,655 | 6/1995 | Chua | |
| 5,469,396 | 11/1995 | Eltoukhy | |
| 5,477,167 | 12/1995 | Chua | |
| 5,479,113 | 12/1995 | Gamal et al. | |
| 5,495,181 | 2/1996 | Kolze | |
| 5,498,979 | 3/1996 | Parlour et al. | 326/38 |
| 5,502,315 | 3/1996 | Chua et al. | |
| 5,525,909 | 6/1996 | McCollum | |
| 5,526,312 | 6/1996 | Eltoukhy | |
| 5,528,600 | 6/1996 | El Ayat et al. | |
| 5,534,793 | 7/1996 | Nasserbakht | |
| 5,537,056 | 7/1996 | McCollum | |
| 5,544,070 | 8/1996 | Cox et al. | 364/489 |
| 5,557,136 | 9/1996 | Gordon et al. | 257/530 |
| 5,572,476 | 11/1996 | Eltoukhy | |
| 5,589,782 | 12/1996 | Sharpe-Geisler | 326/40 |
| 5,594,361 | 1/1997 | Campbell | |
| 5,614,818 | 3/1997 | El Ayat et al. | |
| 5,654,649 | 8/1997 | Chua | |
| 5,712,578 | 1/1998 | Conley | 326/41 |

CLOCK NETWORK FOR FIELD PROGRAMMABLE GATE ARRAY

CROSS-REFERENCE TO RELATED APPLICATION

This application is a continuation-in-part of U.S. application Ser. No. 08/667,702, filed Jun. 21, 1996, now U.S. Pat. No. 5,825,201.

FIELD OF THE INVENTION

This invention relates to field programmable gate arrays. More particularly, this invention relates to field programmable gate arrays employing antifuses.

BACKGROUND INFORMATION

A field programmable gate array (FPGA) is a versatile integrated circuit chip, the internal circuitry of which may be configured before packaging by a manufacturer or after packaging by an individual user to realize a user-specific circuit. To configure an FPGA, the user typically configures an on-chip interconnect structure of the FPGA so that selected circuit components in logic modules of the FPGA are electrically connected together in such a way that the resulting circuit is the user-specific circuit desired by the user. In an FPGA employing, for example, amorphous silicon antifuses, selected amorphous silicon antifuses electrically disposed between selected routing conductors in the interconnect structure are "programmed" to connect the selected routing conductors together electrically. Which antifuses are programmed and which antifuses are left unprogrammed determines how the circuit components of the numerous logic modules are interconnected and therefore determines the resulting circuit. FPGAs can employ other types of antifuse structures including, for example, antifuses employing nitrides and oxides. For further details on FPGAs and antifuses, see U.S. Pat. Nos. 5,557,136, 5,544,070, and 5,220,213 all of which are incorporated herein by reference in their entirety.

It is desired to provide a clock network wherein a clock signal can be provided to the clock inputs of flip-flops in numerous logic cells with a minimum delay from a dedicated clock pad to the flip-flop clock inputs. It is also desired to make the clock network versatile so that the clock network can be driven by the output of a logic cell rather than from the dedicated clock pad.

SUMMARY

A clock network of a field programmable gate array has a first clock bus extending across the chip in a first dimension. A clock pad can be coupled to the first clock bus if the clock network is to be driven from the clock pad. An output of a selected logic cell can be coupled to the first clock bus if the clock network is to be driven from a logic cell. To increase speed of the clock network, the first clock bus is segmented (in one embodiment, collinearly extending segments can be selectively coupled together via selectively programmable antifuses) so that only a short piece of the first clock bus is used to couple either the pad or the logic cell to the clock network in high speed applications.

This summary does not purport to define the invention. The invention is defined by the claims.

DETAILED DESCRIPTION

Figure 1:
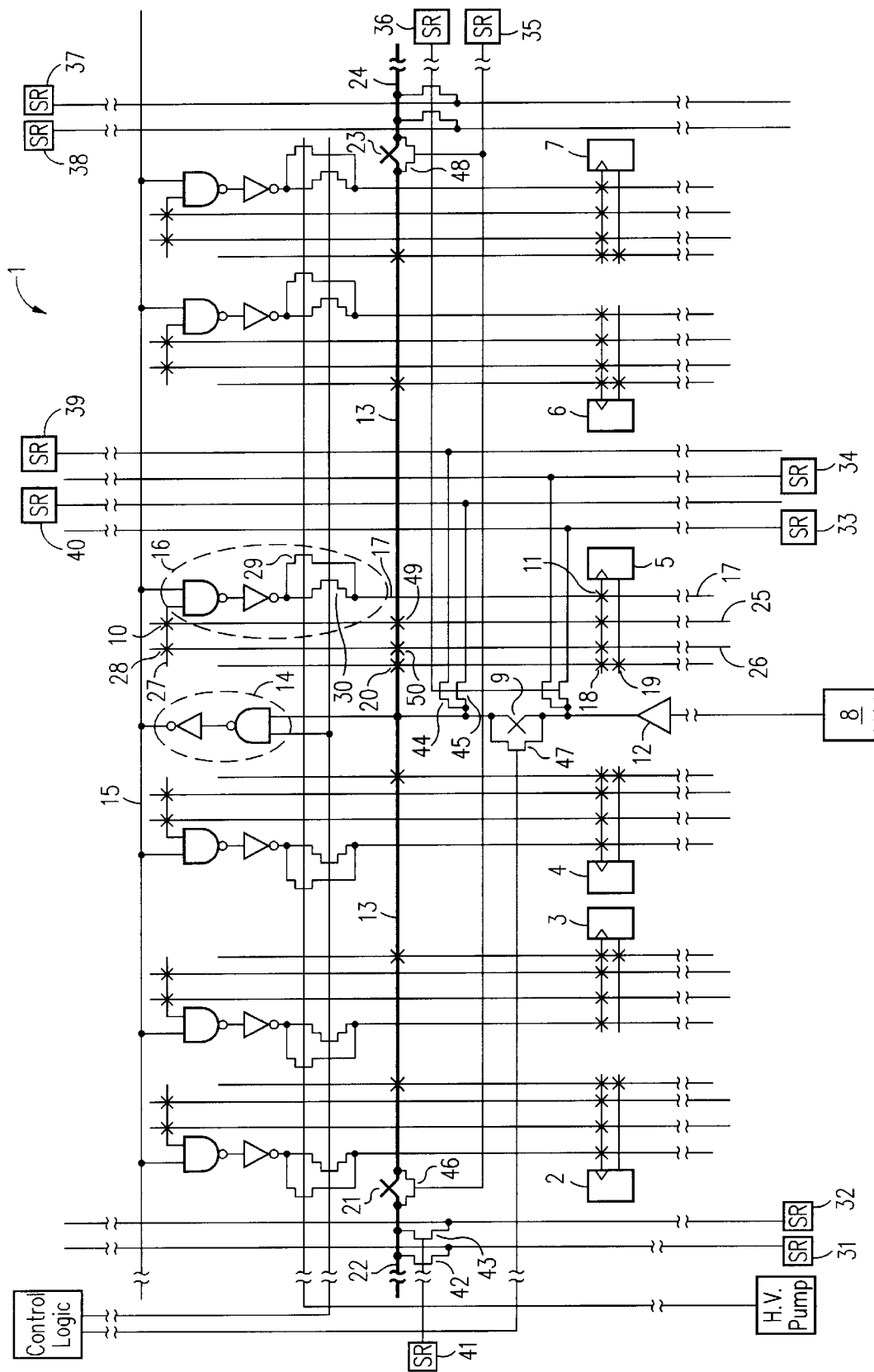
FIG. 1 is a simplified top-down diagram of a bottom half of a field programmable gate array in accordance with an embodiment of the present invention.

FIG. 1 is a simplified top-down diagram of a bottom half of a field programmable gate array 1. There are numerous columns of logic cells, each column being represented in the drawing by a logic cell 2–7. Additional columns of logic cells exist to the left of the column including logic cell 2 and additional columns of logic cells exist to the right of the column including logic cell 7.

To couple a dedicated clock pad 8 to the clock input of logic cell 5, for example, antifuses 9, 10 and 11 are programmed. A clock signal from pad 8 can therefore pass through input buffer 12, through programmed antifuse 9, via a first segment 13 of a horizontally extending segmented first clock bus, through a first driver circuit 14, via a horizontally extending second clock bus 15, through a second driver circuit 16, through a vertically extending third clock bus 17, through programmed cross antifuse 11, through horizontal routing conductor 18 and to the clock input of logic cell 5.

To drive the clock network from a logic cell (for example, from an output of logic cell 5), antifuse 9 is not programmed. Rather cross antifuses 19 and 20 are programmed such that an output of logic cell 5 drives the first segment 13 of the horizontally extending segmented first clock bus. To increase circuit operation, the first segment 13 is made short to have a small capacitance and small series resistance. If antifuse 9 is not programmed, then either antifuse 49 or 50 is programmed to prevent first segment 13 from floating. To allow the first driver circuit to be accessed from columns to the left of the first segment 13, antifuse 21 can be programmed to couple a second segment 22 to first segment 13. Likewise, antifuse 23 can be programmed to couple a third segment 24 to first segment 13. In one embodiment, the first clock bus extends substantially all the way across the field programmable gate array 1 from the leftmost side of the field programmable gate array to the rightmost a second side of the field programmable gate array.

For additional details on the programming architecture of a field programmable gate array and how antifuses are programmed, see U.S. application Ser. No. 08/667,702, entitled "PROGRAMMING ARCHITECTURE FOR A PROGRAMMABLE INTEGRATED CIRCUIT EMPLOYING ANTIFUSES" filed Jun. 21, 1996 (the subject matter of which is incorporated herein by reference). In FIG. 1, there is a vertically extending "tie high" line 25 and a vertically extending "tie low" line 26 associated with third driver circuit 16. If second driver circuit 16 is to be used (a signal is to be enabled to pass from second clock bus 15 to third clock bus 17), then antifuse 10 is programmed to couple input lead 27 to $V_{CC}$ via the "tie high" line 25 (permanently coupled to $V_{CC}$). Antifuse 28 is not programmed. If, on the other hand, second driver circuit 16 is not to be used, then antifuse 28 is programmed to couple input lead 27 to ground via the "tie low" line 26 (permanently coupled to ground) and antifuse 10 is not programmed. Second driver circuit 16 has two high voltage protection transistors 29 and 30. See the U.S. patent application entitled "THREE STATABLE NET DRIVER FOR ANTIFUSE FIELD PROGRAMMABLE GATE ARRAY", filed Dec. 20, 1996, by Wong et al. and the application entitled "POWER-UP CIRCUIT FOR FIELD PROGRAMMABLE GATE ARRAYS", filed Jan. 3, 1997, by Apland et al. (the subject matter of these two applications is incorporated herein by reference) for further details. Programming shift register bits and drivers 31–41 are controlled to program antifuses as set forth in U.S. application Ser. No. 08/667,702.

To program antifuse 21, for example, shift register bit 41 controls programming transistors 42 and 43 to be conductive and shift register bit 36 controls programming transistors 44 and 45 to be conductive. With test transistor 46 controlled to be nonconductive by programming control shift register bit 35, a programming current is driven through antifuse 21 from the drivers of shift register bits 31 and 32 to the drivers of shift register bits 39 and 40, and vice versa. Transistors 46–48 are small test transistors (see U.S. application Ser. No. 08/667,702) and are not used to conduct programming current.

In some embodiments, the antifuses 21, 9 and 23 are amorphous silicon antifuses such as described in U.S. Pat. No. 5,557,136 (the contents of which is incorporated herein by reference). In some such antifuses, if the maximum operating current exceeds a given percentage (for example, 70 percent) of the DC magnitude of the programming current used to program the antifuse, then the electrical characteristics of the programmed antifuse may be affected. Pairs of programming transistors (such as the pair 42 and 43) are therefore provided rather than single programming transistors so that a large amount of programming current can be used to program antifuses 21, 9 and 23 via more programming drivers. The antifuses disposed in the clock network may conduct a large current during clock switching and it is not desired that the electrical characteristics of the programmed antifuses 21, 9 and 23 be affected by large switching currents.

If the segments (for example, 22 and 24) other than first segment 13 are not used, those segments may be used for ordinary routing.

Figure 2:
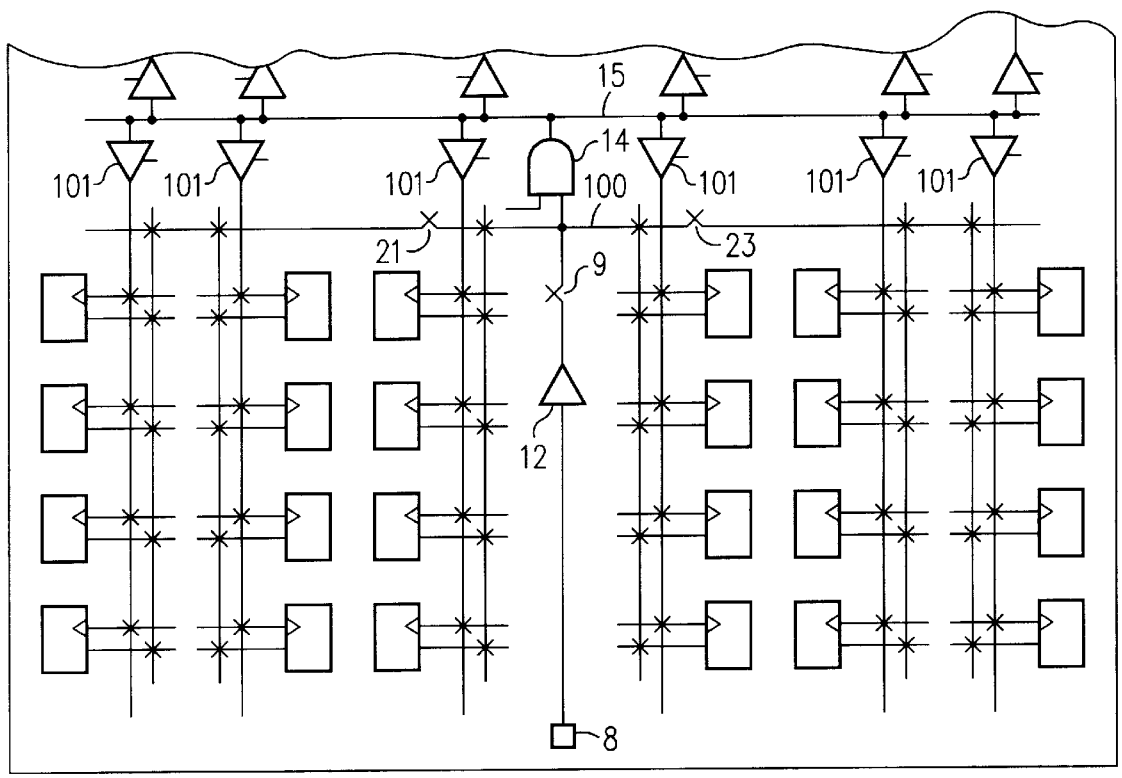
FIG. 2 is a simplified top-down diagram of a bottom half of another embodiment in accordance with the present invention.

FIG. 2 is a simplified top-down diagram of another embodiment of a field programmable gate array. In this embodiment, first segment 100 of the horizontally extending segmented first clock bus does not span as many columns of logic cells as does the first segment 13 of FIG. 1. In some embodiments, the second driver circuits are three statable buffers 101 as illustrated in FIG. 2. First driver circuit 14 need not be an AND gate but rather can involve other digital circuitry. Similarly, buffer 12 can involve other circuitry. In some embodiments, segments of the first clock bus are selectively couplable by pass transistors rather than by selectively programmable antifuses. A mix of pass transistors and antifuses can also be used. Antifuse 9 should be disposed relatively close to the horizontal portion of the first segment 100 to reduce the capacitive loading on first segment if antifuse 9 is not programmed. Pad 8 can be located on any side of the field programmable gate array if desired.

Figure 3:
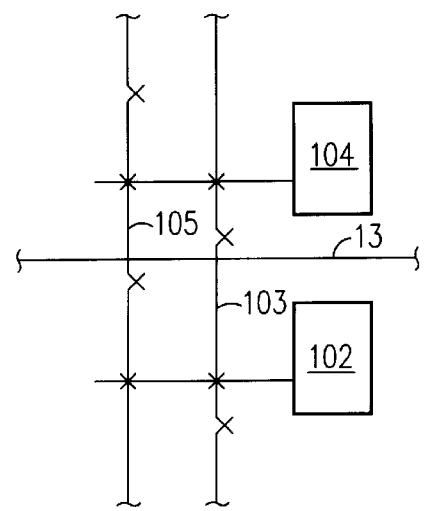
FIG. 3 shows the staggering of antifuses of vertical routing conductors.

FIG. 3 shows the staggering of antifuses of vertical routing conductors. To drive first segment 13 from logic cell 102, vertical routing conductor 103 would be used, whereas to drive first segment 13 from logic cell 104, vertical routing conductor 105 would be used.

Although the present invention is described in connection with certain specific embodiments for instructional purposes, the present invention is not limited thereto. In some embodiments, the first clock bus extends vertically parallel to the columns of logic cells. First segment 13 can be coupled to a pad other than dedicated clock pad 8 if desired. The terms horizontal and vertical are relative to one another and are otherwise not limiting. Accordingly, various modifications, adaptations, and combinations of various features of the described embodiments can be practiced without departing from the scope of the invention as set forth in the claims.

What is claimed is:

1. A field programmable gate array, comprising:
   a first clock bus extending in a first dimension and having a first segment extending in the first dimension, a second segment extending in the first dimension substantially collinear with respect to the first segment, the first segment being programmably couplable to the second segment;
   a first driver circuit having an input coupled to the first segment of the first clock input bus;
   a second clock bus extending in the first dimension parallel to said first clock bus, the second clock bus being coupled to an output of the first driver circuit; and
   a plurality third clock buses extending in a second dimension perpendicular to the first dimension, each third clock bus having a second driver circuit an input of which is coupled to the second clock bus and an output of which is coupled to the third clock bus.

2. The field programmable gate array of claim 1, further comprising:
   a pad; and
   a buffer having an input permanently coupled to the pad and an output permanently coupled to the first segment of the first clock bus.

3. The field programmable gate array of claim 1, further comprising:
   a pad; and
   a buffer having an input permanently coupled to the pad and an output programmably couplable to the first segment of the first clock bus via an antifuse.

4. The field programmable gate array of claim 1, wherein the first segment of the first clock bus is significantly shorter than the second segment of the first clock bus.

5. The field programmable gate array of claim 1, wherein the first clock bus further comprises a third segment extending in the first dimension which is programmably couplable to the first segment, the first segment being disposed collinearly with respect to the second and third segments, the first segment being disposed between the second and third segments.

6. The field programmable gate array of claim 1, wherein the first clock bus extends substantially all the way across the field programmable gate array from a first side of the field programmable gate array to a second side of the field programmable gate array opposite the first side.

7. The field programmable gate array of claim 5, wherein the first segment is programmably couplable to the second segment via a first antifuse and wherein the first segment is programmably couplable to the third segment via a second antifuse.

8. The field programmable gate array of claim 1, wherein each second driver circuit has an input for programmably disabling the second driver circuit such that the output of second driver circuit does not switch regardless of a signal on the second clock bus.

9. The field programmable gate array of claim 8, wherein the input for disabling can be coupled to $V_{CC}$ via a dedicated antifuse.

10. The field programmable gate array of claim 8, wherein the input for disabling can be coupled to ground potential via a dedicated antifuse.

11. The field programmable gate array of claim 1, wherein each second driver circuit includes a high voltage protection transistor which isolates the third clock bus from the associated second driver circuit during antifuse programming.

12. The field programmable gate array of claim 11, wherein each high voltage protection transistor has a gate coupled during normal circuit operation to an output of a charge pump.

13. The field programmable gate array of claim 1, further comprising:

a plurality of columns of logic cells, each column extending in the second dimension parallel to and adjacent to a corresponding third clock bus.

14. A method, comprising:

coupling a pad to only one segment of a segmented first clock bus of a field programmable gate array, the segmented first clock bus having a plurality of segments which can be coupled together; and supplying a signal from the pad and onto a second clock bus via the one segment.

15. The method of claim 14, wherein the pad is coupled to the one segment via a programmed antifuse.

16. The method of claim 14, wherein the segmented first clock bus extends in a first dimension and wherein the second clock bus extends parallel to the segmented first clock bus in the first dimension.

17. A method, comprising:

coupling an output of a logic cell to only one segment of a segmented first clock bus of a field programmable gate array, the segmented first clock bus having a plurality of segments which can be coupled together; and supplying a signal from the logic cell and onto a second clock bus via the one segment.

18. The method of claim 17, wherein the logic cell is coupled to the one segment via a programmed antifuse.

19. The method of claim 17, wherein the segmented first clock bus extends in a first dimension and wherein the second clock bus extends parallel to the segmented first clock bus in the first dimension.

* * * * *